United States Patent
Hikita et al.

(10) Patent No.: US 6,678,315 B1
(45) Date of Patent: Jan. 13, 2004

(54) CODE PHASE SETTING METHOD AND APPARATUS

(75) Inventors: Mahiro Hikita, Kawasaki (JP); Shoji Taniguchi, Kawasaki (JP); Koichi Kuroiwa, Kawasaki (JP); Masami Kanasugi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/447,234

(22) Filed: Nov. 23, 1999

(30) Foreign Application Priority Data

Dec. 24, 1998 (JP) .......................... 10-368090

(51) Int. Cl.⁷ .............................. H04L 5/16
(52) U.S. Cl. .................... 375/222; 708/252; 377/69
(58) Field of Search .................. 375/222, 142, 375/144, 150, 367–368, 343, 324; 708/250, 252, 253; 377/64, 69, 70, 72; 370/320, 335, 342; 331/78

(56) References Cited

U.S. PATENT DOCUMENTS

| | | | | |
|---|---|---|---|---|
| 5,105,376 A | * | 4/1992 | Pedron ...................... | 708/252 |
| 5,237,587 A | * | 8/1993 | Schoolcraft ................ | 375/150 |
| 5,689,526 A | * | 11/1997 | Slonneger et al. .......... | 375/145 |
| 5,867,409 A | * | 2/1999 | Nozuyama ................ | 708/252 |
| 5,910,944 A | * | 6/1999 | Callicotte et al. .......... | 370/311 |
| 6,014,408 A | * | 1/2000 | Naruse et al. .............. | 375/130 |
| 6,061,417 A | * | 5/2000 | Kelem ....................... | 377/26 |
| 6,295,301 B1 | * | 9/2001 | Asano ....................... | 370/514 |

FOREIGN PATENT DOCUMENTS

| | | |
|---|---|---|
| DE | 19714386 C1 | 10/1998 |
| JP | 60177719 A | 9/1985 |
| JP | 08330913 A | 12/1996 |
| JP | 2238294 | 12/2000 |

OTHER PUBLICATIONS

German Office Action and the English language translation are attach hereto.

* cited by examiner

Primary Examiner—Don N. Vo
Assistant Examiner—Khanh Cong Tran
(74) Attorney, Agent, or Firm—Arent Fox Kintner Plotkin & Kahn, PLLC

(57) ABSTRACT

A code phase setting method in a PN coder which includes a shift register is provided. According to the method, an initial value is set in the shift register and a direction is selected among two directions in which direction a value in the shift register is shifted. Then, a code phase is set by shifting the initial value in the direction a necessary number of times.

11 Claims, 10 Drawing Sheets

FIG. 5 PRIOR ART

| PHASE VALUE | REGISTER VALUE | | | | |
|---|---|---|---|---|---|
| | X1 | X2 | X3 | X4 | X5 |
| 0 | 1 | 1 | 1 | 1 | 1 |
| 1 | 0 | 1 | 1 | 1 | 1 |
| 2 | 0 | 0 | 1 | 1 | 1 |
| 3 | 0 | 0 | 0 | 1 | 1 |
| 4 | 1 | 0 | 0 | 0 | 1 |
| 5 | 1 | 1 | 0 | 0 | 0 |
| 6 | 0 | 1 | 1 | 0 | 0 |
| 7 | 1 | 0 | 1 | 1 | 0 |
| 8 | 1 | 1 | 0 | 1 | 1 |
| 9 | 1 | 1 | 1 | 0 | 1 |
| 10 | 0 | 1 | 1 | 1 | 0 |
| 11 | 1 | 0 | 1 | 1 | 1 |
| 12 | 0 | 1 | 0 | 1 | 1 |
| 13 | 1 | 0 | 1 | 0 | 1 |
| 14 | 0 | 1 | 0 | 1 | 0 |
| 15 | 0 | 0 | 1 | 0 | 1 |
| 16 | 0 | 0 | 0 | 1 | 0 |
| 17 | 0 | 0 | 0 | 0 | 1 |
| 18 | 1 | 0 | 0 | 0 | 0 |
| 19 | 0 | 1 | 0 | 0 | 0 |
| 20 | 0 | 0 | 1 | 0 | 0 |
| 21 | 1 | 0 | 0 | 1 | 0 |
| 22 | 0 | 1 | 0 | 0 | 1 |
| 23 | 1 | 0 | 1 | 0 | 0 |
| 24 | 1 | 1 | 0 | 1 | 0 |
| 25 | 0 | 1 | 1 | 0 | 1 |
| 26 | 0 | 0 | 1 | 1 | 0 |
| 27 | 1 | 0 | 0 | 1 | 1 |
| 28 | 1 | 1 | 0 | 0 | 1 |
| 29 | 1 | 1 | 1 | 0 | 0 |
| 30 | 1 | 1 | 1 | 1 | 0 |
| 31 | 1 | 1 | 1 | 1 | 1 |
| 32 | 0 | 1 | 1 | 1 | 1 |
| 33 | 0 | 0 | 1 | 1 | 1 |
| 34 | 0 | 0 | 0 | 1 | 1 |

FIG. 8

| PHASE VALUE | REGISTER VALUE | | | | |
|---|---|---|---|---|---|
| | X 1 | X 2 | X 3 | X 4 | X 5 |
| 0 | 1 | 1 | 1 | 1 | 1 |
| 1 | 1 | 1 | 1 | 1 | 0 |
| 2 | 1 | 1 | 1 | 0 | 0 |
| 3 | 1 | 1 | 0 | 0 | 1 |
| 4 | 1 | 0 | 0 | 1 | 1 |
| 5 | 0 | 0 | 1 | 1 | 0 |
| 6 | 0 | 1 | 1 | 0 | 1 |
| 7 | 1 | 1 | 0 | 1 | 0 |
| 8 | 1 | 0 | 1 | 0 | 0 |
| 9 | 0 | 1 | 0 | 0 | 1 |
| 10 | 1 | 0 | 0 | 1 | 0 |
| 11 | 0 | 0 | 1 | 0 | 0 |
| 12 | 0 | 1 | 0 | 0 | 0 |
| 13 | 1 | 0 | 0 | 0 | 0 |
| 14 | 0 | 0 | 0 | 0 | 1 |
| 15 | 0 | 0 | 0 | 1 | 0 |
| 16 | 0 | 0 | 1 | 0 | 1 |
| 17 | 0 | 1 | 0 | 1 | 0 |
| 18 | 1 | 0 | 1 | 0 | 1 |
| 19 | 0 | 1 | 0 | 1 | 1 |
| 20 | 1 | 0 | 1 | 1 | 1 |
| 21 | 0 | 1 | 1 | 1 | 0 |
| 22 | 1 | 1 | 1 | 0 | 1 |
| 23 | 1 | 1 | 0 | 1 | 1 |
| 24 | 1 | 0 | 1 | 1 | 0 |
| 25 | 0 | 1 | 1 | 0 | 0 |
| 26 | 1 | 1 | 0 | 0 | 0 |
| 27 | 1 | 0 | 0 | 0 | 1 |
| 28 | 0 | 0 | 0 | 1 | 1 |
| 29 | 0 | 0 | 1 | 1 | 1 |
| 30 | 0 | 1 | 1 | 1 | 1 |
| 31 | 1 | 1 | 1 | 1 | 1 |
| 32 | 1 | 1 | 1 | 1 | 0 |
| 33 | 1 | 1 | 1 | 0 | 0 |
| 34 | 1 | 1 | 0 | 0 | 1 |

CODE PHASE SETTING METHOD AND APPARATUS

BACKGROUND OF THE INVENTION

1. Field of the Invention

The present invention generally relates to a code phase setting method in a coder which is used for a spread-spectrum communication technique, a PN coder, a GOLD coder and an apparatus using the coder.

2. Description of the Related Art

The spread-spectrum communication technique, which is applied to a CDMA (code division multiple access) communication, is resistant to jamming or interference and offers a high degree of privacy. In the spread-spectrum communication technique, a digitized voice signal is modulated with a spreading code and signals of a plurality of channels are multiplexed within the same frequency band and sent from a sending side. At a receiving side, the voice signal is demodulated (despread) with the same spreading code as the one used for modulating. A PN code or a GOLD code is used for the spreading code. The GOLD code is a code sequence obtained by performing on EXOR (Exclusive OR) operation on two M sequence codes.

FIG. 1 is a conceptual diagram showing a method for assigning a speech channel in CDMA. In CDMA, speech channels are assigned in a frequency band with a unique code for each of the speech channels. A plain parallel to a frequency axis and a power axis at the time of T in FIG. 1 shows that the speech channels are assigned with the unique codes in the direction of the power axis, that is, in the direction of a spectrum power.

FIG. 2 is a block diagram of an example of a communication system using the spread-spectrum communication technique. As shown in the figure, an EXOR operation on a spreading code from a spreading coder 12 and transmitting data is performed in an EXOR circuit 14 such that the transmitting data is spread and modulated. Then, modulated data is sent by a high-frequency circuit 16. At a receiver 20, regenerated data is obtained by demodulating (despreading) received data with a spreading code which has the same waveform as the spreading code used for spreading and modulating the transmitting data.

FIG. 3 is a timing chart showing an operation in the communication system shown in FIG. 2. As shown in FIG. 3, in the example, the spreading code B is a rectangular wave switching at a faster rate than the transmitting data A. That is, as shown in FIG. 3, the value of the spreading code B changes several times in a bit period of the transmitting data A. As mentioned above, received data D which is spread and modulated at the transmitting side is demodulated (despread) with a spreading code E which has the same waveform as the spreading code such that the regenerated data F is obtained.

FIG. 4 is a block diagram of a PN (Pseudo-Random Noise) coder which is used for the spreading coder according to a conventional technique. As shown in the figure, the PN coder includes a shift register in which FFs (flip-flops) 30–34 are cascaded and an EXOR circuit 35. In the example, a code is generated according to a generator polynomial X5+X3+1. The PN coder is an M sequence coder.

The operation of the PN coder will be described in the following. An initial value is set in the FFs, which is an initial state. Stored data in a FF is shifted to a next FF on the right side one after another. A value in the FF 34 is an output of the PN sequence at the time. In addition, an EXOR operation on an output X3 from the FF 32 and an output X5 from the FF 34 is performed in the EXOR circuit 35, and the result is received in the FF 30.

FIG. 5 is a table showing state transitions in the PN coder shown in FIG. 4. As shown in FIG. 5, the register value changes from a state in which X1–X5 are all 1 as phase 0 to a state in which X1–X4 are 1 and X5 is 0 as phase 30. In phase 31, the register value returns to the value of phase 0 and the same state transitions as the state transitions starting from the phase 0 start from phase 31.

FIG. 6 is a block diagram showing a GOLD coder which is also used as a spreading coder. As shown in FIG. 6, the GOLD coder generates a code by performing an EXOR operation on output values from two M sequence coders. As the M sequence coder, for example, the PN coder shown in FIG. 4 can be used. The GOLD code is a non-M sequence code.

When it is necessary to set a specific code phase in the shift register in the above-mentioned PN coder, a value read from a memory in which memory one or a plurality of phase values are stored beforehand is set as an initial value in the shift register, and the specific code phase is set by shifting the initial value a necessary number of times in the shift register in one direction. The memory may be in the PN coder or may be connected to the PN coder.

For example, when the memory stores values of phase 0 and phase 15 beforehand, and when it is necessary to set a value of phase 14 in the shift register, first, a value of phase 0 is set in the shift register as an initial value, then the initial value needs to be shifted 14 times.

However, according to the above-mentioned conventional technology, when the number of the shifts from an initial state is large, it takes much time to set a necessary code phase. In addition, when the number of values which are stored beforehand in a memory is increased, a large amount of memory area becomes necessary.

SUMMARY OF THE INVENTION

It is an object of the present invention to provide a code phase setting method in a coder and the coder which reduce time for setting a code phase.

The above object of the present invention is achieved by a code phase setting method in a PN coder which includes a shift register, the code phase setting method including the steps of:

setting an initial value in the shift register;

selecting a direction among two directions in which direction a value in the shift register is shifted; and setting a code phase by shifting the initial value in the direction a necessary number of times.

According to the above-mentioned invention, since a value in the shift register can be shifted in either direction, it becomes possible to reduce time for setting a code phase from an initial phase.

BRIEF DESCRIPTION OF THE DRAWINGS

Other objects, features and advantages of the present invention will become more apparent from the following detailed description when read in conjunction with the accompanying drawings, in which:

FIG. 5 is a table showing state transitions in the PN coder shown in FIG. 4;

FIG. 8 is a table showing state transitions in a reverse direction;

DETAILED DESCRIPTION OF THE PREFERRED EMBODIMENTS

Figure 4:
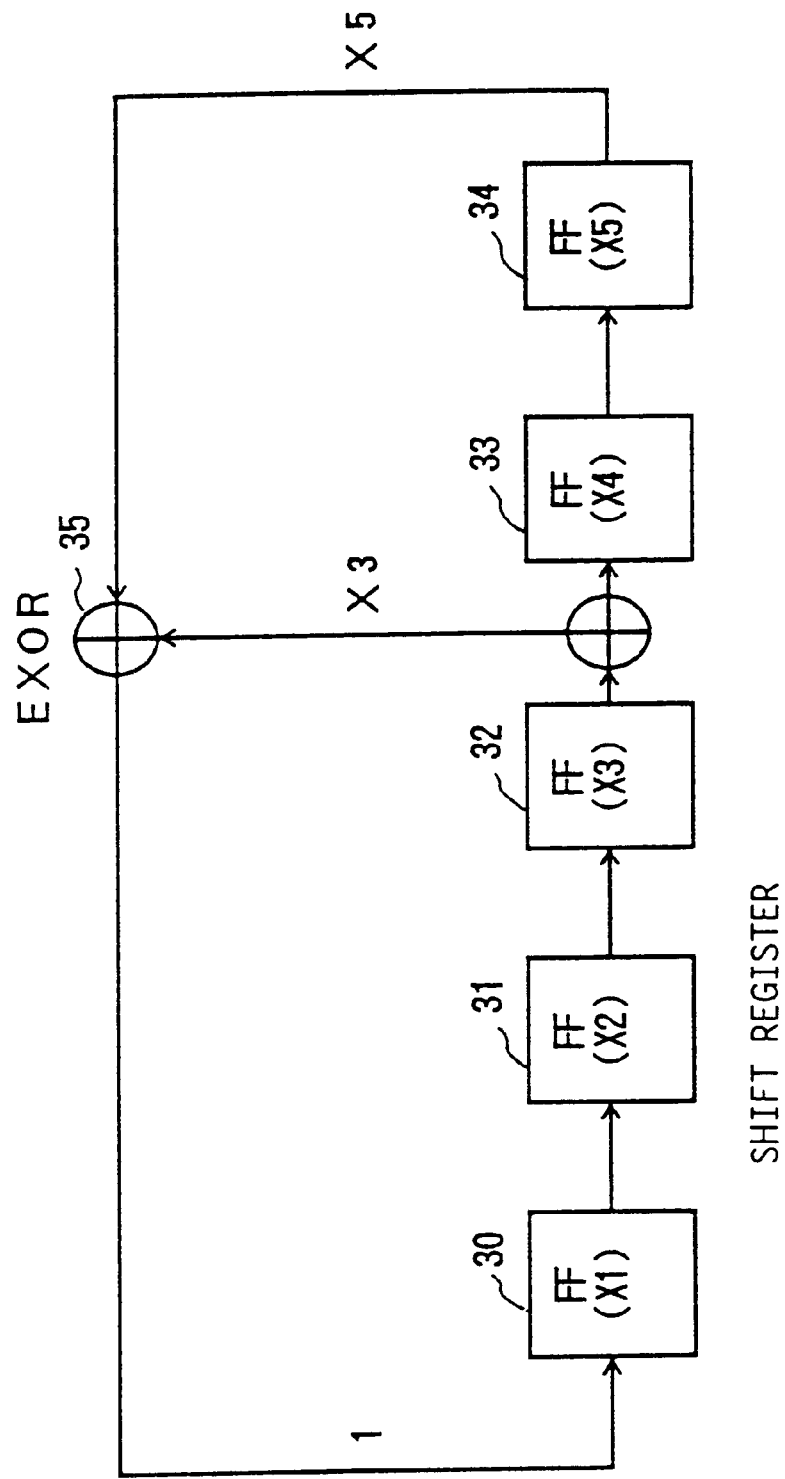
FIG. 4 is a block diagram of a PN (Pseudo-Random Noise) coder according to a conventional technique.
Figure 7:
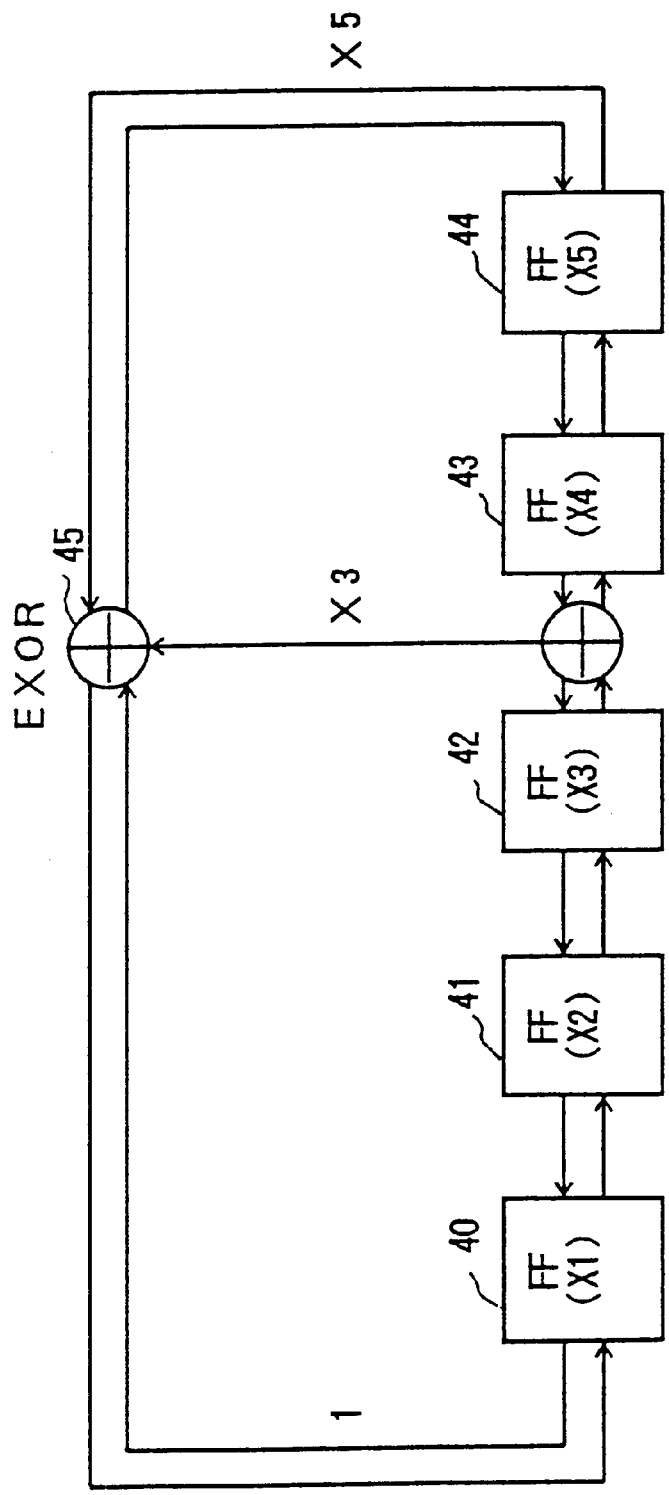
FIG. 7 is a block diagram of a PN coder according to an embodiment of the present invention.

FIG. 7 is a block diagram of a PN coder according to an embodiment of the present invention. As shown in FIG. 7, the PN coder includes a shift register in which FFs (flip-flops) 40–44 are cascaded and an EXOR circuit 45. A code is generated according to a generator polynomial $X5+X3+1$. The shift register according to the embodiment can shift data in the right direction and in the direction opposite to the right direction (left direction), which is different from the shift register shown in FIG. 4.

FIG. 8 is a table showing state transitions in the case of the reverse-direction shift. As shown in FIG. 8, when the value in the shift register is shifted in the reverse (left) direction from the value of phase 0 in which X1–X5 are all 1, the state transitions are the same as state transitions when shifting backward from phase 31 in FIG. 5. For example, a value of phase 3 in FIG. 8 is the same as a value of phase 28 in FIG. 5 which is the third backward-shifted phase from phase 31.

In order to set a value of phase 28 shown in FIG. 5 when the shift register is reset to phase 0, it is necessary to shift 28 times according to the conventional PN coder. On the other hand, it is enough to shift only three times after resetting the shift register to phase 0 according to the present invention since the PN coder of the present invention can shift the value in the shift register in the reverse direction.

In addition, in order to set phase 14 shown in FIG. 5 when values of phase 0 and 15 are stored in a memory as the initial value, at least 14 shifts are necessary according to the conventional PN coder. On the other hand, according to the present invention, the value of phase 14 in FIG. 5 can be set with only one shift by setting phase 15 in FIG. 5 as the initial value.

When the PN coder has only one initial value, the initial value can be set quickly. When the memory stores a plurality of values as the initial value, the number of shifts becomes smaller by selecting an initial value closest to a necessary code phase among the stored values, thereby the time for setting the necessary code phase value can be reduced.

Figure 9:
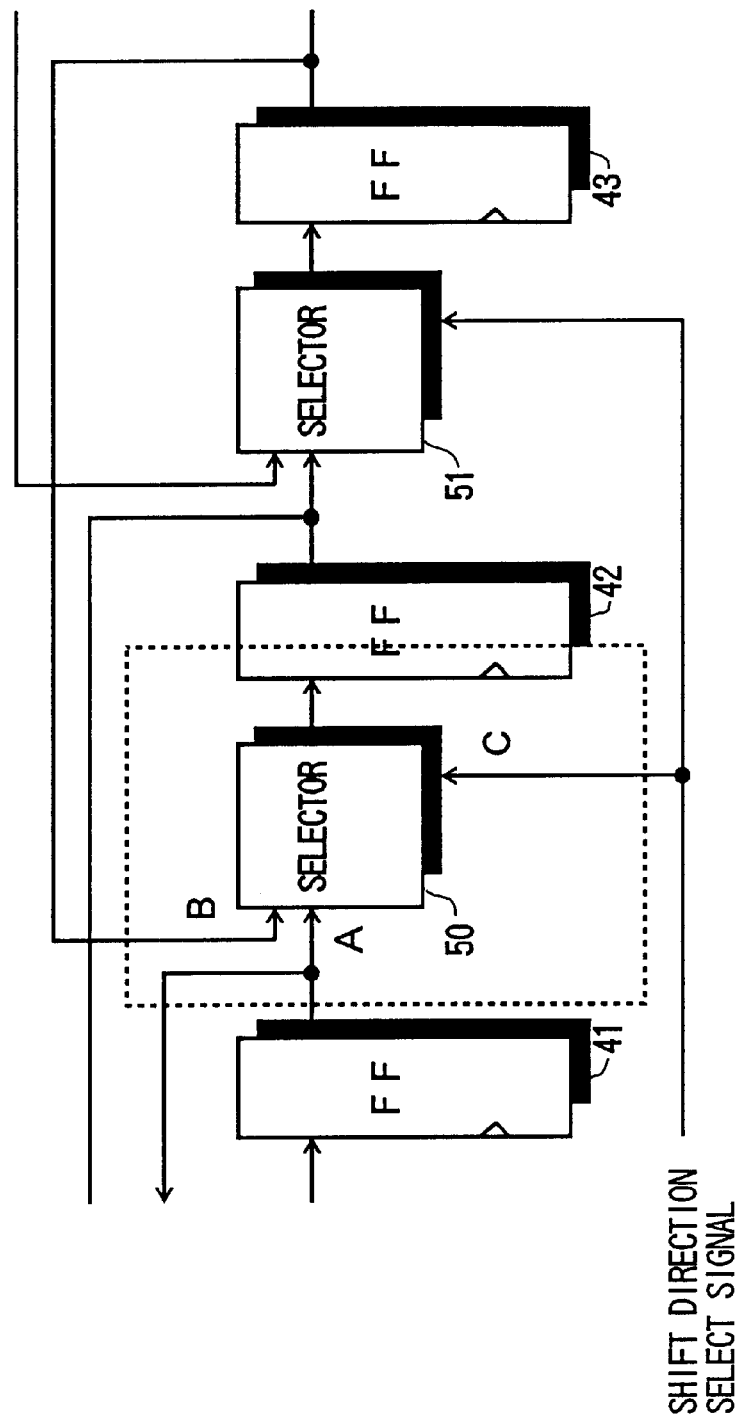
FIG. 9 is a block diagram showing a shift register of the PN coder according to an embodiment of the present invention.

FIG. 9 is a block diagram showing the shift register of the PN coder of the present invention. The operation will be described with reference to FIG. 9.

FIG. 9 shows a part of the FFs shown in FIG. 7. As shown in FIG. 9, the shift register includes selectors, provided between FFs, which select a signal. A selector 50 receives a signal A from the FF 41 and a signal B from the FF 43. Then, the selector 50 selects the signal A when a shift direction select signal C indicates forward shifting, and selects the signal B when the shift direction select signal C indicates reverse shifting. After that, the FF 42 receives the selected signal. Other FFs operate in the same way. Accordingly, the shift register which enables both-way shifting is realized. A content in the shift direction select signal can be determined in the PN coder or can be determined outside of the PN coder.

Figure 6:
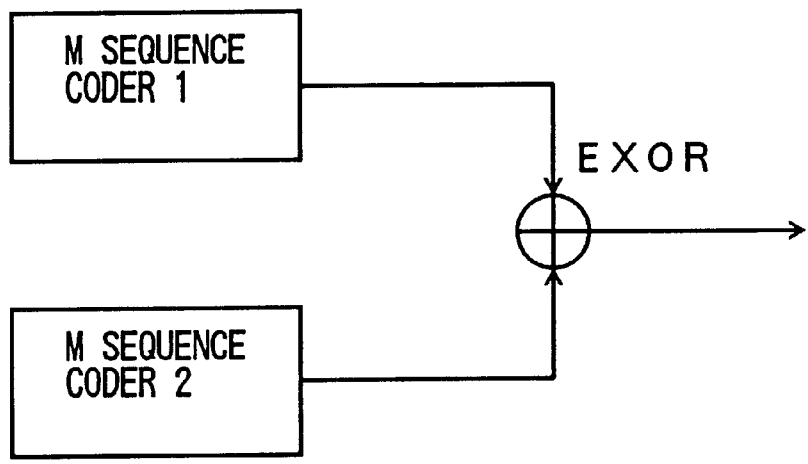
FIG. 6 is a block diagram of a GOLD coder according to a conventional technique.

In addition, the GOLD coder of the present invention uses the PN coder of the present invention as an M sequence coder shown in FIG. 6.

Figure 1:
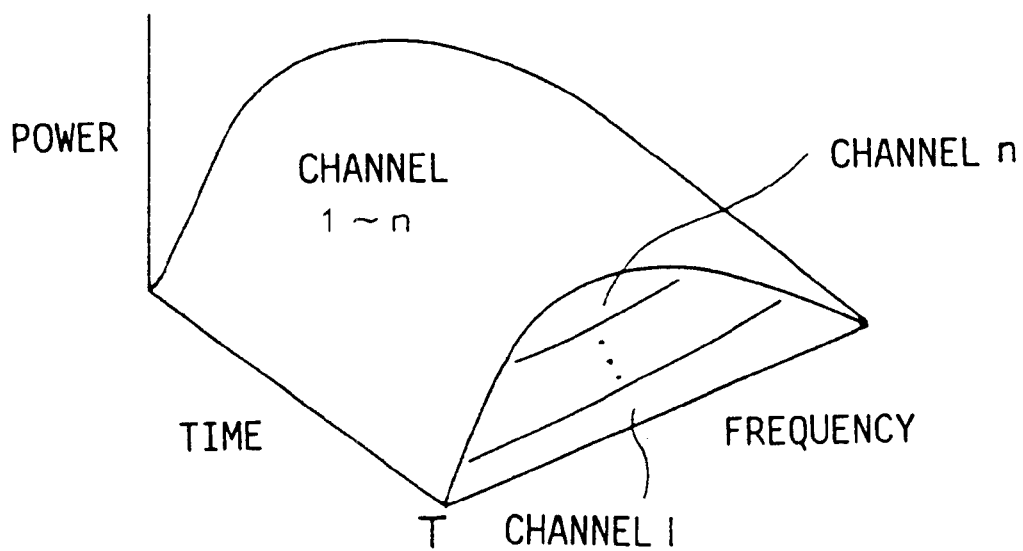
FIG. 1 is a conceptual diagram showing a method for assigning a speech channel in CDMA.
Figure 2:
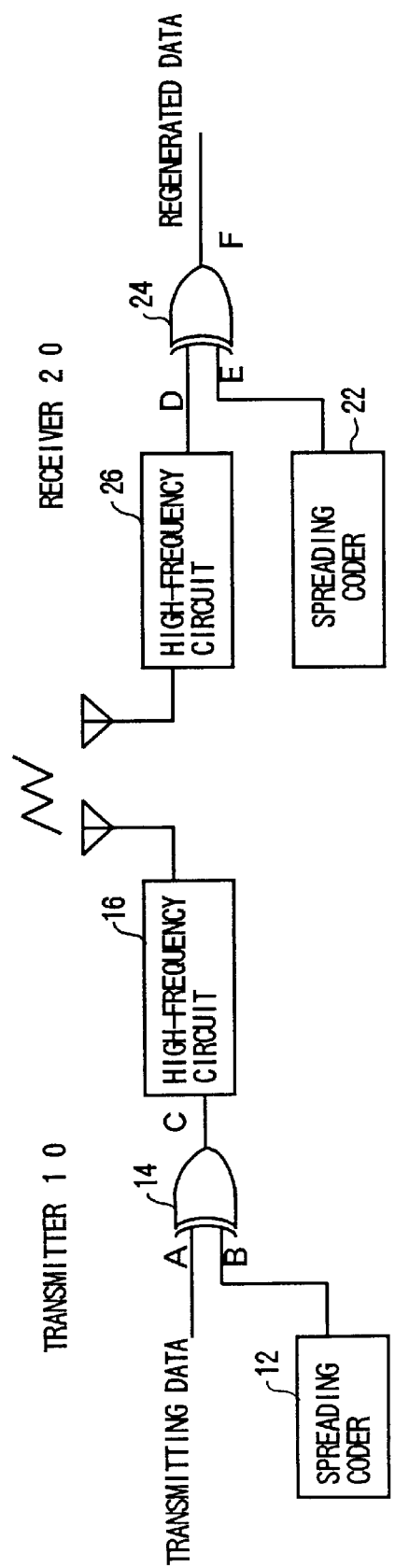
FIG. 2 is a block diagram of an example of a communication system using a spread spectrum communication technique.
Figure 3:
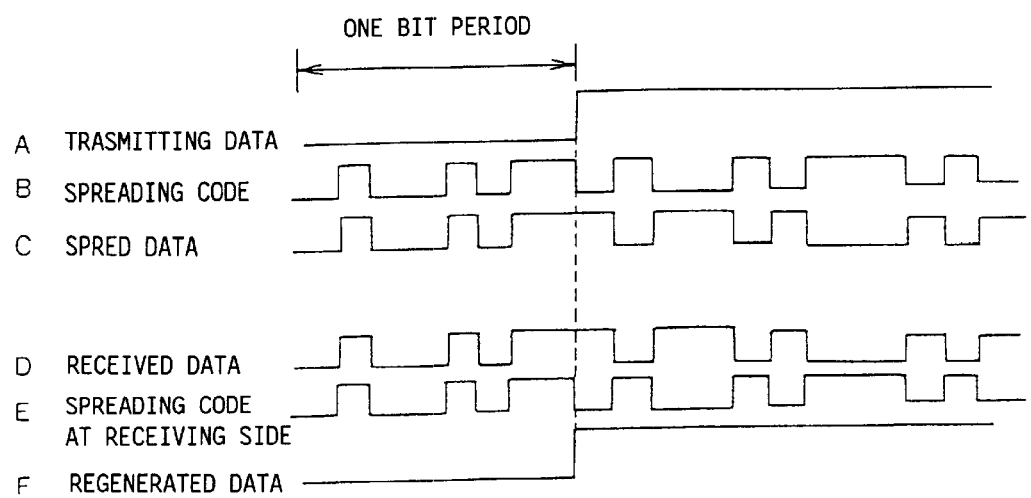
FIG. 3 is a timing chart showing an operation of the communication system.
Figure 10:
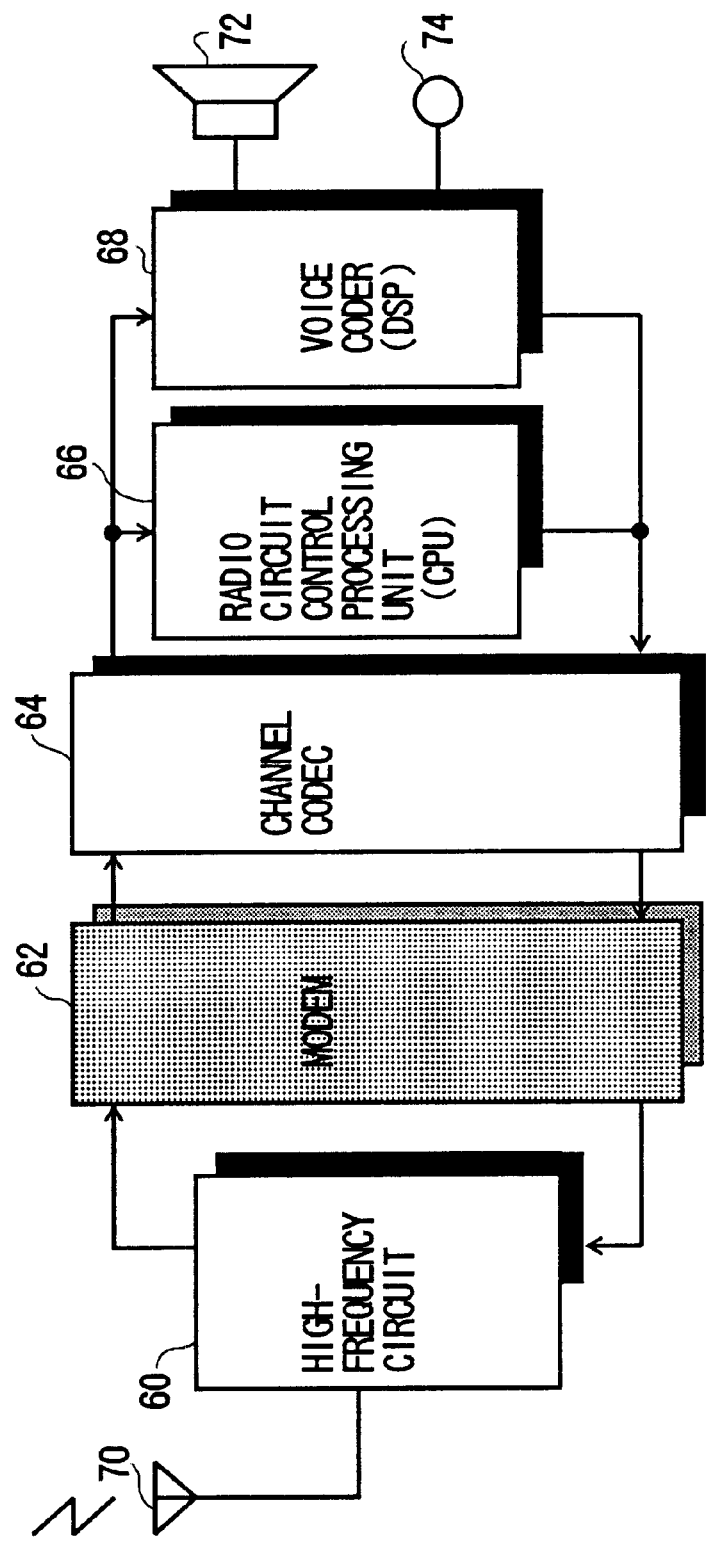
FIG. 10 is a block diagram of a CDMA terminal apparatus according to an embodiment of the present invention.

FIG. 10 is a block diagram of a CDMA terminal apparatus using the PN coder of the present invention. As shown in the figure, the terminal apparatus includes an antenna 70 and a high-frequency circuit 60 for receiving and transmitting a signal, a modem 62 which modulates and demodulates a signal, a channel code 64 which encodes and decodes a channel signal, a radio circuit control processing unit (CPU) 66, a voice coder (DSP) 68 which encodes and decodes voice, a speaker 72 and a microphone 74. The PN coder or the GOLD coder of the present invention is used in the modem 62. In the modem 62, spreading, modulating and demodulating are carried out as described in FIG. 2 and FIG. 3. A code phase in the PN coder in the modem 62 is set according to the present invention. The modem 62 may include a memory which stores the initial values, a part which selects an initial value, and a part which determines the number of shifts for setting the code phase. In addition, the modem may include an EXOR circuit for modulating or demodulating.

According to the modem 62, since a necessary code phase can be set in a shorter time, modulation and demodulation can be carried out more quickly than in a conventional modem. In addition, according to the present invention, a terminal apparatus which operates faster than a conventional terminal apparatus can be obtained.

The PN coder and the GOLD coder can be configured by an integrated circuit. In addition, the modem of the present invention which includes the PN coder or the GOLD coder can be configured by an integrated circuit.

The PN coder is applicable to apparatuses other than ones for CDMA as long as the apparatuses use the M sequence coder.

As mentioned above, according to the PN coder or the GOLD coder of the present invention, since the value in the shift register can be shifted in two directions for setting a code phase, the time for setting a necessary code phase can be reduced without increasing a memory amount for storing initial values. Therefore, by using the PN coder or the GOLD coder of the present invention, a faster speed without increasing a memory amount can be realized in a modem. In addition, a terminal apparatus including the modem used for a CDMA communication may be provided.

The present invention is not limited to the specifically disclosed embodiments, and variations and modifications may be made without departing from the scope of the invention.

What is claimed is:

1. A code phase setting method in a PN coder which includes a shift register having flip-flops, said code phase setting method comprising the steps of:

setting an initial value in said shift register;

providing a selector between said flip-flops, said selector selecting a direction among two directions in which direction a value in said shift register is shifted; said selector selecting a signal according to a shift direction select signal; and setting a code phase by shifting said initial value in said direction a necessary number of times.

2. The code setting method as claimed in claim 1, wherein said PN coder prepares one value for said initial value, and said step of setting an initial value comprises the step of resetting said shift register to said one value.

3. The code setting method as claimed in claim 1, wherein said PN coder prepares a plurality of values for said initial value, and said step of setting said initial value comprising the step of:

setting a value closest to said code phase among said plurality of values in said shift register.

4. A PN coder which Includes a shift register, said PN coder comprising:

a selector which selects a direction among two directions In which direction a value in said shift register is shifted; and a flip-flop which shifts an initial value In said shift register in said direction, wherein said shift register includes said selector between said flip-flop and said selector selects a signal according to a shift direction select signal.

5. A GOLD coder comprising a PN coder as an M sequence coder, said PN coder comprising:

a shift register;

a selector which selects a direction among two directions in which direction a value in said shift register is shifted; and a flip-flop which shifts an Initial value in said shift register in said direction;

wherein said PN coder includes said selector between said flip-flop and said selector selects a signal according to a shift direction select signal.

6. A modem which is used for a code division multiple access communication, said modem comprising:

a PN coder comprising a shift register, a selector which selects a direction a flip-flop part which shifts an initial value in said shift register in said direction, wherein said PN coder includes said selector between said flip-flops and said selector selects a signal according to a shift direction select signal;

an initial value setting part which sets said initial value in said shift register, a part which sets a code phase by shifting said initial value in a selected direction a necessary number of times; and a part which modulates and demodulates with a code of said code phase.

7. The modem as claimed in claim 6, wherein said initial value setting part comprises:

a part which stores a plurality of values for said initial value; and a part which sets a value closest to said code phase among said plurality of values in said shift register.

8. A terminal apparatus for a code division multiple access communication comprising a modem said modem including:

a PN coder comprising a shift register, a selector which selects a direction among two directions in which direction a value in said shift register is shifted, and a flip-flop which shifts an initial value in said shift register in said direction, wherein said PN coder includes said selector between said flip-flop and said selector selects a signal according to a shift direction select signal;

an initial value setting part which sets said initial value in said shift register;

a part which sets a code phase by shifting said initial value in a selected direction a necessary number of times; and a part which modulates and demodulates with a code of said code phase.

9. A modem which is used for a code division multiple access communication, said modem comprising:

a GOLD coder comprising a PN coder which includes a shift register, a selector which selects a direction among two directions in which direction a value in said shift register is shifted, and a flip-flop which shifts an initial value in said shift register in said direction, wherein said PN coder includes said selector between said flip-flop and said selector selects a signal according to a shift direction select signal;

an initial value setting part which sets said initial value in said shift register;

a part which sets a code phase by shifting said initial value in a selected direction a necessary number of times; and a part which modulates and demodulates with a code of said code phase.

10. The modem as claimed in claim 9, wherein said initial value setting part comprises:

a part which stores a plurality of values for said initial value; and a part which sets a value closest to said code phase among said plurality of values in said shift register.

11. A terminal apparatus for a code division multiple access communication comprising a modem, said modem including;

a GOLD coder comprising a PN coder which includes a shift register, a selector which selects a direction among two directions in which direction a value in said shift register is shifted, and a flip-flop which shifts an initial value in said shift register in said direction, wherein said PN coder includes said selector between said flip-flop and said selector selects a signal according to a shift direction select signal;

an initial value setting part which sets said initial value in said shift register;

a part which sets a code phase by shifting said initial value in a selected direction a necessary number of times; and a part which modulates and demodulates with a code of said code phase.

* * * * *

UNITED STATES PATENT AND TRADEMARK OFFICE
CERTIFICATE OF CORRECTION

PATENT NO. : 6,678,315 B1
DATED : January 13, 2004
INVENTOR(S) : Mahiro Hikita et al.

It is certified that error appears in the above-identified patent and that said Letters Patent is hereby corrected as shown below:

Column 5,
Lines 21 and 32, delete "a flip-flop" and substitute therefor -- flip-flops --.
Lines 21, 32 and 42, delete "shifts" and substitute therefor -- shift --.
Lines 25 and 36, delete "flip-flop" and substitute therefor -- flip-flops --.
Line 42, insert a comma as follows: -- selects a direction, --.
Line 42, delete "a flip-flop part" and substitute therefor -- flip-flops --.

Column 6,
Lines 6, 7, 23 and 47, delete "a flip-flop" and substitute therefor -- flip-flops --.
Lines 7, 23 and 47, delete "shifts" and substitute therefor -- shift --.
Lines 10, 26 and 50, delete "flip-flop" and substitute therefor -- flip-flops --.

Signed and Sealed this

Twelfth Day of October, 2004

JON W. DUDAS
*Director of the United States Patent and Trademark Office*